US008848374B2

(12) United States Patent
Lin et al.

(10) Patent No.: US 8,848,374 B2
(45) Date of Patent: Sep. 30, 2014

(54) METHOD AND STRUCTURE FOR DISSIPATING HEAT AWAY FROM A RESISTOR HAVING NEIGHBORING DEVICES AND INTERCONNECTS

(75) Inventors: Jian-Hong Lin, Huwei Township (TW); Chin Chuan Peng, Jhudong Township (TW); Tzu-Li Lee, Huwei Township (TW); Bi-Ling Lin, Hsinchu (TW); Bor-Jou Wei, Jiaoxi Township (TW); Chien Shih Tsai, Baoshan Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 71 days.

(21) Appl. No.: 12/827,742

(22) Filed: Jun. 30, 2010

(65) Prior Publication Data
US 2012/0002375 A1   Jan. 5, 2012

(51) Int. Cl.
*H05K 7/20* (2006.01)
*H01L 49/02* (2006.01)
*H01L 23/522* (2006.01)
*H01L 23/367* (2006.01)

(52) U.S. Cl.
CPC ............ *H01L 28/20* (2013.01); *H01L 23/5228* (2013.01); *H01L 23/3677* (2013.01)
USPC ....... 361/710; 361/676; 361/679.54; 361/688

(58) Field of Classification Search
USPC ........................ 361/676–678, 679.46–679.54, 361/688–722, 760, 764, 783, 803, 831
See application file for complete search history.

(56) References Cited

U.S. PATENT DOCUMENTS

| 5,864,169 | A  | * | 1/1999  | Shimura et al. | 257/587 |
|-----------|----|---|---------|----------------|---------|
| 2002/0063330 | A1 | * | 5/2002 | Macris | 257/712 |
| 2003/0052386 | A1 | * | 3/2003 | Yamaguchi | 257/536 |
| 2003/0116552 | A1 | * | 6/2003 | Santoruvo et al. | 219/209 |
| 2003/0160298 | A1 | * | 8/2003 | Nakamura | 257/530 |
| 2006/0231945 | A1 |   | 10/2006 | Chinthakindi et al. | |
| 2007/0108388 | A1 | * | 5/2007 | Lane et al. | 250/353 |
| 2007/0120060 | A1 | * | 5/2007 | Lane et al. | 250/353 |
| 2008/0102584 | A1 | * | 5/2008 | Kerr et al. | 438/275 |
| 2009/0152679 | A1 | * | 6/2009 | Harada | 257/538 |
| 2012/0049324 | A1 | * | 3/2012 | Le Neel et al. | 257/537 |

OTHER PUBLICATIONS

Office Action dated Dec. 5, 2012 from corresponding application No. CN201010594455.2.

* cited by examiner

*Primary Examiner* — Courtney Smith
(74) *Attorney, Agent, or Firm* — Lowe Hauptman & Ham, LLP

(57) ABSTRACT

A semiconductor structure for dissipating heat away from a resistor having neighboring devices and interconnects. The semiconductor structure includes a semiconductor substrate, a resistor disposed above the semiconductor substrate, and a thermal protection structure disposed above the resistor. The thermal protection structure has a plurality of heat dissipating elements, the heat dissipating elements having one end disposed in thermal conductive contact with the thermal protection structure and the other end in thermal conductive contact with the semiconductor substrate. The thermal protection structure receives the heat generated from the resistor and the heat dissipating elements dissipates the heat to the semiconductor substrate.

20 Claims, 3 Drawing Sheets

METHOD AND STRUCTURE FOR DISSIPATING HEAT AWAY FROM A RESISTOR HAVING NEIGHBORING DEVICES AND INTERCONNECTS

BACKGROUND

Resistors are critical components in applications such as analog, logic, and mixed signal integrated circuits. With continued scaling of device features and demands for higher processing speeds, integrated circuits consume more and more power and generate more heat. Joule heating, a process by which a current passing through a resistor releases heat has become a major concern for resistors. Often, the heat generated by a resistor will impact the resistor's neighboring devices (e.g., transistors, capacitors, etc.) and interconnects resulting in reliability and performance issues. This is especially problematic in the area of metallization where metal layers are sandwiched between insulating materials on a substrate.

Various solutions have been proposed to provide heat dissipation to integrated circuits. One such method is to attach heat sinks to the backside of a die or printed circuit board. Another is to blow air using cooling fans. However, such methods address the heat dissipation for the device package and, therefore, may not be particularly suitable or efficient in conducting heat away from neighboring devices or interconnects of a resistor.

Accordingly, what is needed is a method and structure for reducing the thermal impact on a resistor's neighboring devices and interconnects.

BRIEF DESCRIPTION OF THE DRAWINGS

The features, aspects, and advantages of the disclosure will become more fully apparent from the following detailed description, appended claims, and accompanying drawings in which:

DESCRIPTION

In the following description, numerous specific details are set forth to provide a thorough understanding of the embodiments of the present disclosure. However, one having an ordinary skill in the art will recognize that embodiments of the disclosure can be practiced without these specific details. In some instances, well-known structures and processes have not been described in detail to avoid unnecessarily obscuring the embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
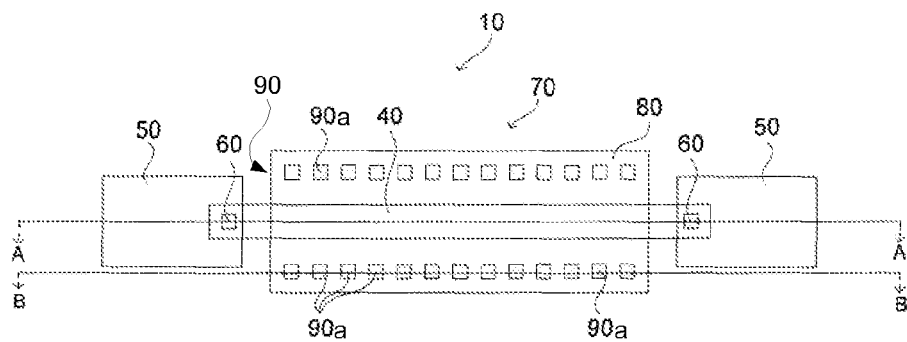
FIG. 1 is a top view of a semiconductor structure for dissipating heat away from a resistor having neighboring devices and interconnects, according to one embodiment of the present disclosure.
Figure 2:
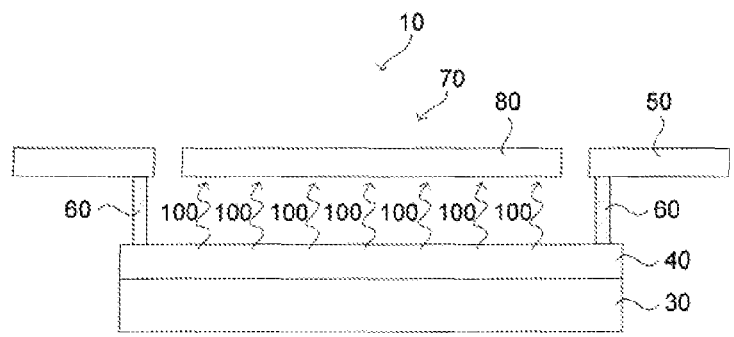
FIG. 2 is a side view of the structure of FIG. 1 taken along the line A-A.
Figure 3:
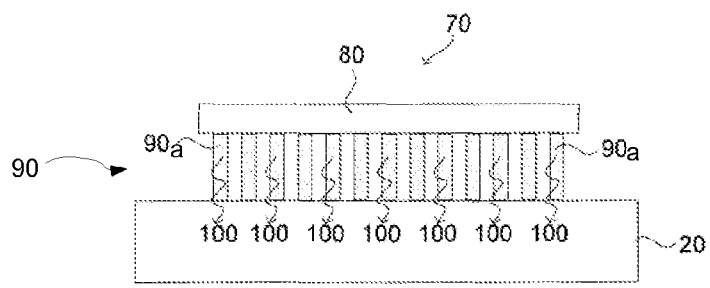
FIG. 3 is a side view of the structure of FIG. 1 taken along the line B-B.

FIG. 1 is a top view of a semiconductor structure 10 for dissipating heat away from a resistor 40 having neighboring devices and interconnects (not shown), according to one embodiment of the present disclosure. FIG. 2 is a side view of the structure of FIG. 1 taken along the line A-A, whereas FIG. 3 is a side view of the structure of FIG. 1 taken along the line B-B. The semiconductor structure 10 includes a semiconductor substrate 20, a resistor 40 disposed above the semiconductor substrate 20, and a thermal protection structure 70 having a metal cap layer 80 and a plurality of heat dissipating elements 90 in thermal conductive contact with the metal cap layer 80 and the substrate 20. In some embodiments, heat dissipating elements 90 include contact stacks 90a. In other embodiments, heat dissipating elements 90 include contact bars 90b. Contact stacks 90a and contact bars 90b may be identified throughout as heat dissipating elements 90. Substrate 20 may include active and passive devices formed therein and vias, contacts, conductive layers, dielectric layers (e.g., interlayer dielectric (ILD)), and isolation regions (e.g., shallow trench isolation (STI)) formed thereabove. The substrate 20 may comprise of a semiconductor material such as silicon (Si), germanium (Ge), or gallium arsenide or may be an electrically insulating material.

The resistor layer or resistor 40 is formed above the semiconductor substrate 20, and in one embodiment resistor 40 is formed above an isolation region such as a shallow trench isolation layer 30, as depicted in FIG. 2. Resistor 40 may be formed from a material comprising one of polysilicon, tantalum nitride, titanium nitride, tungsten, aluminum alloy, titanium alloy, copper alloy, or any other suitable resistor material. The resistor material can be selected based on a particular implementation and a desired result. Any suitable technique for forming the resistor 40 can be employed such as physical vapor deposition (PVD), metal organic chemical vapor deposition (MOCVD), pulsed laser deposition (PLD), atomic layer deposition (ALD), and other film growth techniques. Alternatively, resistor 40 can be formed employing low pressure chemical vapor deposition (LPCVD), plasma enhanced chemical vapor deposition (PECVD), high density plasma chemical vapor deposition (HDPCVD), or various sputtering techniques, to a thickness suitable for forming a resistor layer. FIGS. 1-3 depict resistor 40 having an elongated rectangular shape. It is to be understood, however, that the scope of the disclosure is not limited to any particular shape of the resistor 40.

A pair of metal terminals or terminal contacts 50 extend through an insulating layer (not shown) at opposite ends of resistor 40. The terminal contacts 50 connect resistor 40 to other components (not shown) in the integrated circuit. Each of the terminal contacts 50 is electrically connected through a plug or via 60 to a side of resistor 40. In an exemplary embodiment, the terminal contacts 50 are formed of metal, such as tungsten, copper, aluminum or other conductive material. The vias 60 are also formed of metal, such as tungsten, copper, aluminum or other conductive material. It is appreciated that the scope of the disclosure is not limited to any particular configuration or material of the terminal contacts 50 or the vias 60.

Disposed above and/or in close proximity with resistor 40 is the thermal protection structure 70. The thermal protection structure 70 comprises a metal cap layer 80 and a plurality of heat dissipating elements 90 in thermal conductive contact therewith. The metal cap layer 80 is formed of metal, such as tungsten, copper, aluminum or other conductive material; and as depicted in FIGS. 1-3 has an elongated rectangular shape. It is appreciated, however, that the scope of the disclosure is not limited to any particular shape of the metal cap layer 80. The heat dissipating elements 90 are also formed of metal, such as tungsten, copper, aluminum or other conductive material. However, it should be clear to one of ordinary skill in the art, based on this disclosure, that the heat dissipating elements 90 may be formed of any other material suitable for efficiently conducting heat. Likewise, individual elements of the plurality of heat dissipating elements 90 may also be selectively formed of differing, suitable materials according to a particular implementation and a desired result.

Figure 4:
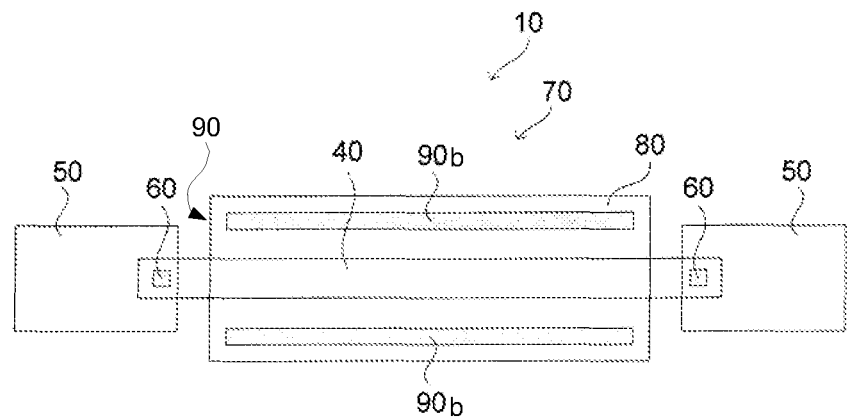
FIG. 4 is a top view of a semiconductor structure for dissipating heat away from a resistor, according to another embodiment of the present disclosure.
Figure 5:
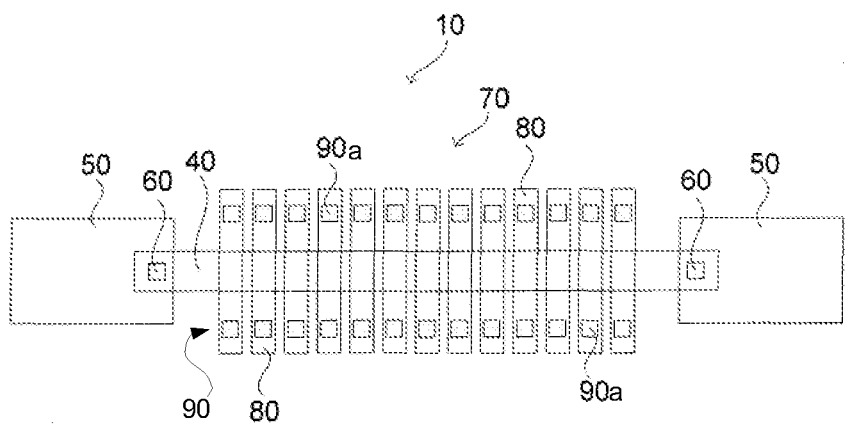
FIG. 5 is a top view of a semiconductor structure for dissipating heat away from a resistor, according to yet another embodiment of the present disclosure.
Figure 6:
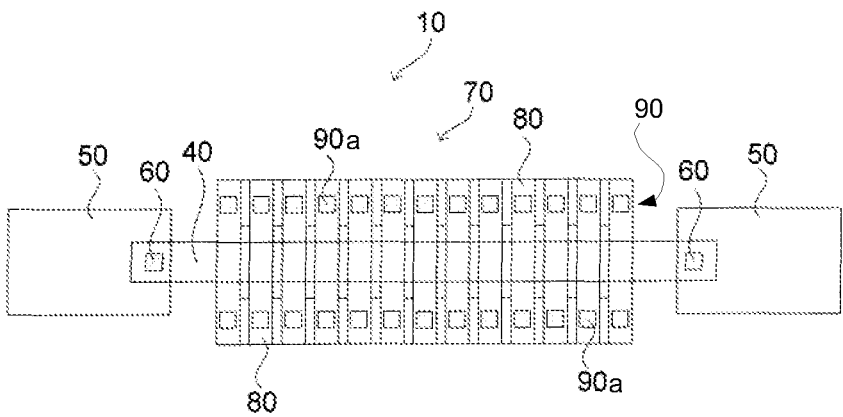
FIG. 6 is a top view of a semiconductor structure for dissipating heat away from a resistor, according to yet another embodiment of the present disclosure.
Figure 7:
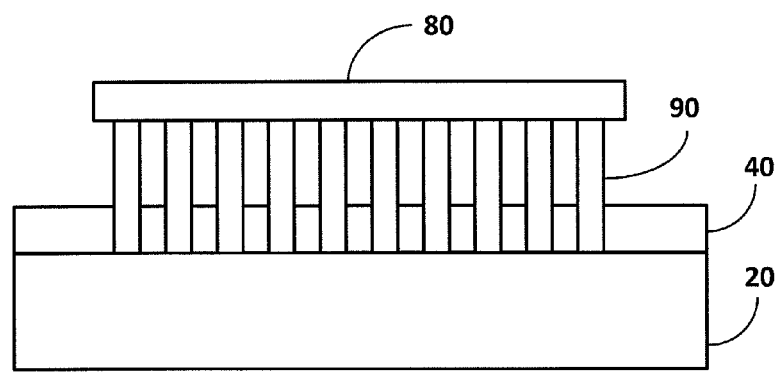
FIG. 7 is a side view of an embodiment according to yet another embodiment of the present disclosure.
Figure 8:
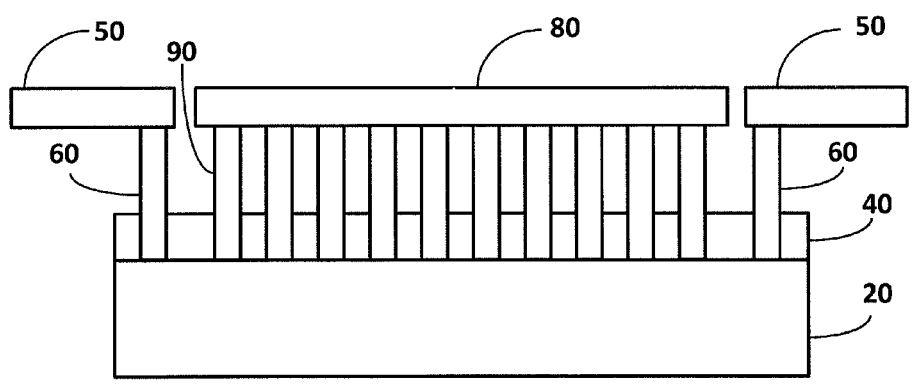
FIG. 8 is a side view of an embodiment according to yet another embodiment of the present disclosure.

The plurality of heat dissipating elements 90 may comprise a plurality of contact stacks 90, according to one embodiment of the present disclosure. As depicted in FIG. 3, each of the plurality of contact stacks 90 has one end disposed in thermal conductive contact with the metal cap layer 80 and the other end in thermal conductive contact with semiconductor substrate 20. The plurality of contact stacks 90 is located along and in contact with the metal cap layer 80, according to one embodiment of the present disclosure. According to another embodiment, as depicted in FIG. 7, the plurality of contact stacks 90 is disposed substantially around or near the edges of the metal cap layer 80. According to yet another embodiment of the present disclosure, the plurality of heat dissipating elements 90 comprise two or more contact bars, each of the contact bars running substantially parallel to a side edge of the metal cap layer 80, as depicted in FIG. 4. According to yet another embodiment, the metal cap layer 80 comprises a plurality of separated metal cap layers, each of the plurality of separated metal cap layers having one or more contact stacks 90 in thermal conductive contact therewith, as depicted in FIG. 5. According to yet another embodiment, the metal cap layer 80 comprises a plurality of contiguous metal cap layers, each of the plurality of contiguous metal cap layers having one or more contact stacks 90 in thermal conductive contact therewith, as depicted in FIG. 6. FIG. 8 depicts such a configuration where the contact stacks 90 in thermal conductive contact with the plurality of contiguous cap layers are in contact with the substrate 40. FIG. 3 depicts each of the plurality of heat dissipating elements 90 as having a column shape. It is appreciated, however, that the scope of the disclosure is not limited to any particular shape of the heat dissipating elements 90.

The construction and structure of heat dissipating elements 90 should be substantially the same as the construction and structure of passive (e.g., metal layers) and/or active components of a device and may be formed at the same time that passive and/or active components are formed. To simplify fabrication of the plurality of heat dissipating elements 90, the same are made from the same or substantially same material as conventional interconnect structures, according to one exemplary embodiment.

It is understood by those skilled in the art that the placement and number of heat dissipating elements 90 (e.g., contact stacks and contact bars) disposed in semiconductor structure 10 as well as the dimensions of each of the heat dissipating elements 90 are determined based on the circuit pattern, the design rules for integrated circuit fabrication, and heat dissipation concerns for efficiently channeling the heat 100 from the resistor 40 to the substrate 20.

In operation, the thermal protection structure 70 provides a heat sink from the resistor 40 to the substrate 20, greatly reducing the temperature increase in an integrated circuit. The metal cap layer 80 receives the thermal flow or heat 100 generated from the resistor 40 and transfers the heat 100 to the heat dissipating elements 90, whereby the heat dissipating elements 90 dissipate the thermal energy 100 to and through the semiconductor substrate, away from neighboring devices and interconnects of the resistor 40. This arrangement spreads the thermal energy 100 across the thermal protection structure 70 so that it may be drawn off and dissipated to a larger surface area, such as substrate 20.

The resulting configurations and processes as taught herein are straightforward, economical, uncomplicated, highly versatile and effective, can be implemented by adapting known technologies, and are thus fully compatible with conventional manufacturing processes and technologies.

In the preceding detailed description, the present disclosure is described with reference to specific exemplary embodiments thereof. It will, however, be evident that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of invention as expressed herein.

What is claimed is:

1. A semiconductor structure for dissipating heat away from a resistor having neighboring devices and interconnects, comprising:
   a semiconductor substrate;
   a resistor disposed above the semiconductor substrate; and
   a thermal protection structure comprising a thermal protection element disposed above the resistor and a plurality of heat dissipating elements extending from the thermal protection element directly to the semiconductor substrate, and surrounding the resistor by a gap having a non-zero predetermined distance, the plurality of heat dissipating elements having one end disposed in thermal conductive contact with the thermal protection element and the other end in thermal conductive contact with the semiconductor substrate, the thermal protection element for receiving heat generated by the resistor and the plurality of heat dissipating elements for dissipating the heat generated by the resistor through the semiconductor substrate,
   wherein the thermal protection element comprises a plurality of separated cap layers, and wherein each separated cap layer of the plurality of separated cap layers is connected to a corresponding heat dissipating element of the plurality of heat dissipating elements.

2. The semiconductor structure of claim 1, wherein the cap layer is primarily made of metal.

3. The semiconductor structure of claim 2, wherein the plurality of heat dissipating elements are disposed along the metal cap layer.

4. The semiconductor structure of claim 2, wherein each of the plurality of heat dissipating elements comprises a contact stack.

5. The semiconductor structure of claim 2, wherein the plurality of heat dissipating elements comprise two or more contact bars, each of the contact bars running substantially parallel to a side edge of the metal cap layer.

6. A semiconductor structure for dissipating heat away from a resistor having neighboring devices and interconnects, comprising:
 a semiconductor substrate;
 a resistor disposed above the semiconductor substrate; and
 a thermal protection structure comprising a thermal protection element disposed above the resistor and a plurality of heat dissipating elements extending from the thermal protection element, and surrounding the resistor by a gap having a non-zero predetermined distance, the plurality of heat dissipating elements having one end disposed in thermal conductive contact with the thermal protection element and the other end in thermal conductive contact with the semiconductor substrate, the thermal protection element for receiving heat generated by the resistor and the plurality of heat dissipating elements for dissipating the heat generated by the resistor through the semiconductor substrate,
 wherein the thermal protection element comprises a plurality of separated metal cap layers, each of the plurality of separated metal cap layers having at least one of the plurality of heat dissipating elements in thermal contact therewith and in thermal contact with the semiconductor substrate.

7. The semiconductor structure of claim 1, further comprising one or more terminal contacts formed on ends of the resistor.

8. A resistor structure for reducing thermal impact on neighboring devices and interconnects, comprising:
 a semiconductor substrate;
 a resistor disposed above the semiconductor substrate; and
 a thermal protection structure comprising a thermal protection element disposed above the resistor and a plurality of heat dissipating elements extending from the thermal protection element and surrounding the resistor by a gap having a non-zero predetermined distance, the plurality of heat dissipating elements having one end disposed in thermal conductive contact with the thermal protection element and the other end in thermal conductive contact with the semiconductor substrate, the thermal protection element for receiving heat generated by the resistor and the plurality of heat dissipating elements for dissipating the heat generated by the resistor through the semiconductor substrate,
 wherein the thermal protection element comprises a plurality of separate metal cap layers, each separated metal cap layer of the plurality of separated metal cap layers having at least one of the plurality of heat dissipating elements in thermal contact therewith.

9. The resistor structure of claim 8, wherein the resistor is formed from a material comprising one of polysilicon, tantalum nitride, titanium nitride, tungsten, aluminum alloy, titanium alloy or copper alloy.

10. The resistor structure of claim 8, wherein the plurality of heat dissipating elements are disposed substantially around the thermal protection element.

11. The resistor structure of claim 8, wherein each of the plurality of heat dissipating elements comprises a contact stack.

12. A method for dissipating heat away from a resistor and neighboring devices and interconnects, comprising:
 providing the semiconductor substrate according to claim 1 by at least an action including forming the resistor above the semiconductor substrate; and
 receiving heat generated by the resistor, via the thermal protection element and dissipating the heat generated by the resistor through the semiconductor substrate, via the plurality of heat dissipating elements.

13. The method of claim 12, wherein the plurality of heat dissipating elements are disposed substantially around the thermal protection element.

14. The semiconductor structure of claim 1, wherein the resistor is formed from a material comprising one of polysilicon, tantalum nitride, titanium nitride, tungsten, aluminum alloy, titanium alloy or copper alloy.

15. The semiconductor structure of claim 6, wherein the resistor is formed from a material comprising one of polysilicon, tantalum nitride, titanium nitride, tungsten, aluminum alloy, titanium alloy or copper alloy.

16. The semiconductor structure of claim 6, wherein the plurality of heat dissipating elements are disposed substantially around the thermal protection element.

17. The semiconductor structure of claim 6, wherein each of the plurality of heat dissipating elements comprises a contact stack.

18. The semiconductor structure of claim 6, further comprising an isolation region formed above the semiconductor substrate, wherein the resistor is formed above the isolation region.

19. The resistor structure of claim 8, further comprising an isolation region formed above the semiconductor substrate, wherein the resistor is formed above the isolation region.

20. The method of claim 12, wherein forming the resistor comprises forming the resistor from a material comprising one of polysilicon, tantalum nitride, titanium nitride, tungsten, aluminum alloy, titanium alloy or copper alloy.

* * * * *